United States Patent
Gilbert et al.

(10) Patent No.: US 9,813,017 B2
(45) Date of Patent: Nov. 7, 2017

(54) ADIABATIC SECONDARY OPTICS FOR SOLAR CONCENTRATORS USED IN CONCENTRATED PHOTOVOLTAIC SYSTEMS

(71) Applicant: OPSUN TECHNOLOGIES INC., Saint-Augustin-de-Desmaures (CA)

(72) Inventors: Raymond Gilbert, Saint-Augustin-de Desmaures (CA); Artashes Yavrian, Québec (CA); Marc Levesque, Saint-Augustin-de-Desmaures (CA); Steeve Tremblay, Saint-Augustin-de-Desmaures (CA)

(73) Assignee: OPSUN TECHNOLOGIES INC., Saint-Augustin-de-Desmaures, Quebec (CA)

( * ) Notice: Subject to any disclaimer, the term of this patent is extended or adjusted under 35 U.S.C. 154(b) by 0 days.

(21) Appl. No.: 14/781,984

(22) PCT Filed: Apr. 4, 2014

(86) PCT No.: PCT/CA2014/050345
§ 371 (c)(1),
(2) Date: Oct. 2, 2015

(87) PCT Pub. No.: WO2014/165987
PCT Pub. Date: Oct. 16, 2014

(65) Prior Publication Data
US 2016/0056758 A1 Feb. 25, 2016

Related U.S. Application Data

(60) Provisional application No. 61/810,431, filed on Apr. 10, 2013.

(51) Int. Cl.
*H02S 40/22* (2014.01)
*F24J 2/06* (2006.01)
(Continued)

(52) U.S. Cl.
CPC ............... *H02S 40/22* (2014.12); *F24J 2/067* (2013.01); *F24J 2/08* (2013.01); *F24J 2/085* (2013.01);
(Continued)

(58) Field of Classification Search
CPC ..... H02S 40/22; H02S 40/20; G02B 19/0038; G02B 19/0042; G02B 19/00; H01L 31/0547; H01L 31/054
See application file for complete search history.

(56) References Cited

U.S. PATENT DOCUMENTS 3,780,722 A 12/1973 Swet
5,796,892 A 8/1998 Karni et al.
(Continued)

FOREIGN PATENT DOCUMENTS

CN 201781437 U 3/2011
CN 202059353 U 11/2011
(Continued)

OTHER PUBLICATIONS

Lee et al, Design and Analysis of Completely Adiabatic Tapered Waveguides by Conformal Mapping,1997, Journal of Lightwave Technology vol. 15 No. 2 pp. 403-410.*
(Continued)

*Primary Examiner* — Bethany L Martin
(74) *Attorney, Agent, or Firm* — Eversheds Sutherland (US) LLP

(57) ABSTRACT

A solar concentrator for concentrating solar radiation toward a solar cell, a concentrated photovoltaic module including a solar concentrator and a solar cell, and a secondary optical element for use in a solar concentrator are provided. The solar concentrator includes a primary optical element for collecting and focusing the solar radiation, and a secondary optical element. The secondary optical element is arranged
(Continued)

to receive the solar radiation collected and focused by the primary optical element and includes an input end, and output end, and an adiabatic light guide tapering from the input end toward the output end and configured for concentrating and adiabatically guiding the solar radiation between the input and output ends. Some embodiments of the present invention can be useful in solar photovoltaic applications where it is desirable to provide high acceptance angles while maintaining high concentration and optical efficiency levels.

20 Claims, 10 Drawing Sheets

(51) Int. Cl.
  F24J 2/08     (2006.01)
  H01L 31/054   (2014.01)
  G02B 6/32     (2006.01)
  G02B 6/42     (2006.01)
  G02B 19/00    (2006.01)
  F21V 8/00     (2006.01)

(52) U.S. Cl.
  CPC ............ *G02B 6/32* (2013.01); *G02B 6/4202* (2013.01); *G02B 19/0042* (2013.01); *H01L 31/054* (2014.12); *G02B 6/0006* (2013.01); *Y02E 10/43* (2013.01); *Y02E 10/52* (2013.01)

(56) References Cited

U.S. PATENT DOCUMENTS

| | | | |
|---|---|---|---|
| 2002/0148497 A1 | 10/2002 | Sasaoka et al. | |
| 2008/0087323 A1* | 4/2008 | Araki ................ | H01L 31/0547 136/256 |
| 2009/0101207 A1 | 4/2009 | Milbourne et al. | |
| 2009/0114280 A1 | 5/2009 | Jensen et al. | |
| 2010/0212742 A1* | 8/2010 | Engel ................ | C03C 3/07 136/259 |
| 2010/0319773 A1 | 12/2010 | West et al. | |
| 2011/0186129 A1* | 8/2011 | Gombert ............ | H01L 31/0547 136/259 |
| 2012/0138047 A1* | 6/2012 | Ashkin .............. | G02B 19/0019 126/619 |
| 2012/0227796 A1* | 9/2012 | Dougherty .......... | H01L 31/0543 136/255 |
| 2012/0241000 A1 | 9/2012 | Wintzer et al. | |
| 2012/0273025 A1 | 11/2012 | Tomlinson et al. | |
| 2012/0305077 A1 | 12/2012 | Arab et al. | |

FOREIGN PATENT DOCUMENTS

| | | |
|---|---|---|
| WO | 2011112842 A1 | 9/2011 |
| WO | 2013158634 A1 | 10/2013 |

OTHER PUBLICATIONS

Supplementary European Search Report for European patent application 14783274.5 in the name of Opsun Technologies Inc.

Park et al., A tapered dielectric waveguide solar concentrator for a compound semiconductor photovoltaic cell, Optics Express, vol. 18, No. 2, p. 1777-1787, Jan. 18, 2010.

Snyder et al., Nonuniform fibers, Optical waveguide theory, p. 89-199, 1983.

Stafford et al., Tracker accuracy: field experience, analysis, and correlation with meteorological conditions, Photovoltaic Specialists Conference (PVSC), 2009 34th IEEE, p. 002256-002259, Jun. 7-12, 2009.

* cited by examiner

ADIABATIC SECONDARY OPTICS FOR SOLAR CONCENTRATORS USED IN CONCENTRATED PHOTOVOLTAIC SYSTEMS

TECHNICAL FIELD

The present invention generally relates to the field of solar concentrators for use concentrated photovoltaic systems, and more particularly concerns an improved secondary optical element which can increase the acceptance angle of such solar concentrators.

BACKGROUND

Solar power generation involves collecting solar radiation and converting it to usable energy. Existing technologies for harvesting solar energy include, for example, solar heating and solar photovoltaics. Solar photovoltaics encompass methods of generating electrical power which operate by converting solar radiation into direct current electricity using solar cells made of materials exhibiting the photovoltaic effect. Photovoltaic technology includes concentrating and non-concentrating systems.

Non-concentrating systems include flat panels of photovoltaic solar cells that directly receive solar radiation. In flat panel photovoltaic technology, the solar cells are made of silicon and cover essentially the whole exposed surface of the panels. Current commercial efficiency of silicon-based solar cells is about 16%. Given that silicon has a spectral response limited to the range from 450 to 900 nanometers (nm), commercial expectation of conventional photovoltaic technology does not exceed about 20%.

Concentrated photovoltaic (CPV) systems use solar concentrators made of lenses, mirrors or other optical components to concentrate large amounts of solar radiation onto a small area of photovoltaic solar cells to generate electricity. For example, high concentration photovoltaic (HCPV) systems use solar concentrators that can concentrate sunlight to intensities of 100 and 2500 suns or more onto a multi-junction solar cell (1 sun=1 kW/m$^2$). In solar concentrators, solar radiation may undergo various states of refraction and reflection before reaching the multi-junction solar cells. Compared to non-concentrated photovoltaic systems, the solar cell elements in CPV systems may be made more compact. As a result, the amount of photovoltaic material, which is generally one of the most expensive elements in solar power generation systems, can be reduced and costs can be lowered.

The efficiency of a solar concentrator depends not only on the amount of solar energy captured by the solar concentrator, but also on its ability to accurately direct the concentrated sunlight onto solar cells having a relatively small photovoltaic area. In contrast to their non-concentrating counterparts, CPV systems generally need to remain constantly aligned with the direct normal incidence (DNI) solar radiation, which is collimated at an angle of approximately ±0.27 degree. Improper alignment can cause a significant portion of the available energy to be lost. In order to maintain proper alignment, CPV modules are typically mounted on high-precision tracking systems (e.g., with precision of the order of ±0.1 to ±0.2 degree) that track the sun as it moves across the sky so as to maximize exposure to and collection of the DNI solar radiation.

The tolerance of a solar concentrator to misalignment with respect to DNI solar radiation may be characterized by the "acceptance angle" of the solar concentrator. In the CPV field, the acceptance angle is often defined as the angle of incidence of solar radiation at which the energy losses of the concentrator are increased by a certain amount, generally 10%, compared to the energy losses at DNI. The acceptance angle of a solar concentrator varies inversely with its concentration factor such that for a given acceptance angle, there exists a maximum theoretical concentration factor that cannot be exceeded. However, although currently used HCPV systems can achieve a wide range of concentration factors, their acceptance angles are generally limited to ±0.5 to ±0.8 degree.

As mentioned above, HCPV systems typically use multi-junction solar cells based on III-V semiconductors rather than silicon-based solar cells. Multi-junction solar cells generally include three layers, each layer being tuned to extract energy in a specific wavelength band of the solar spectrum. As a result, triple-junction cells can exhibit better spectral response than silicon-based cells, with an energy conversion efficiency of sunlight into electricity expected to be around 55%. Commercial efficiency of currently available triple-junctions cells is about 40-44%.

Solar concentrators for use in CPV modules operate by focusing DNI solar radiation to the photovoltaic solar cells. Solar concentrators commonly use a primary optical element and a secondary optical element. Incident solar radiation is first focused by the primary optical element for concentrating solar power. The concentrated solar radiation is directed toward the secondary optical element, which can provide homogenization and, optionally, further concentration. Each of the primary and secondary optical elements may include refractive, reflective and diffractive optics.

In solar concentrators used in HCPV modules, the overall concentration factor is usually provided mainly by the primary optical element, while the secondary optical element is used mainly for homogenization purposes. More specifically, the role of the secondary optical element is mainly to distribute the solar radiation concentrated by the primary optical element uniformly across the photovoltaic area of the solar cell. The homogenization provided by the secondary optical element contributes to enhancing energy conversion efficiency and mitigating the risk of forming "hot spots" which could lead to poor fill factors, to cell damage or to failure.

In refractive-type solar concentrators, Fresnel lenses are generally used as a primary optical element because of their low manufacturing costs. However, Fresnel lenses exhibit optical transmission coefficients limited to between about 80 and 85%. As result, HCPV systems based on Fresnel lenses and triple-junction solar cells would be expected to exhibit a peak efficiency of about 32% (i.e., 40%×80%), which is about twice the overall efficiency of non-concentrated photovoltaic technology. However, the effective efficiency (i.e., the actual kWh generated) of commercial HCPV systems generally does not exceed 23%. Attempts to increase the efficiency of solar concentrators have included using better tracking systems to maximize the intensity of incoming radiation, and modifying the materials entering the fabrication of optical components to enhance their reflective and refractive properties. The efficiency of HCPV solar contractors has also been addressed by changing the design of their individual components in view of increasing the acceptance angle.

In this context, a recent study [B. Stafford et al., "Tracker accuracy: field experience, analysis, and correlation with meteorological conditions" *Photovoltaic Specialists Conference (PVSC)*, 2009 34th IEEE, p. 002256-002259, 7-12 Jun. 2009] has measured the performances of real HCPV systems installed in the field, and has highlighted the importance of the acceptance angle in their overall efficiency. The study found that HCPV modules having acceptance angles of ±0.5 degree and ±1 degree would respectively generate 60% and 25% of additional losses, even when using high-precision tracking systems with precision of the order of ±0.1 to ±0.2 degree. In other words, because of these additional losses, HCPV systems with low acceptance angles will tend to lose their alignment with DNI solar radiation more easily, thus collecting and generating significantly less energy than predicted. These additional losses can arise from manufacturing defects and misalignment as well as from deformations caused by external influences such as, for example, wind, energy fluctuations between DNI and circumsolar solar radiations, long term aging, temperature, gravity, mechanical stress, and the like.

In light of the above, it will be understood that solar concentrators having large acceptance angle can increase the efficiency of CPV systems, which, in turn, can decrease the cost-per-kWh and help drive solar power generation toward grid parity.

There therefore remains a need in the art for solar concentrators having improved acceptance angles while maintaining high concentration factors and optical efficiency.

SUMMARY

In accordance with an aspect of the invention, there is provided a solar concentrator for concentrating solar radiation toward a solar cell. The solar concentrator includes:
  a primary optical element for collecting and focusing the solar radiation; and
  a secondary optical element arranged to receive the solar radiation collected and focused by the primary optical element, the secondary optical element including an input end, an output end and an adiabatic light guide tapering from the input end toward the output end, the adiabatic light guide being configured for concentrating and adiabatically guiding the solar radiation between the input and output ends.

In accordance with another aspect of the invention, there is provided a concentrated photovoltaic module including:
  a solar concentrator for concentrating solar radiation, including:
    a primary optical element for collecting and focusing the solar radiation; and
    a secondary optical element arranged to receive the solar radiation collected and focused by the primary optical element, the secondary optical element including an input end, an output end and an adiabatic light guide tapering from the input end toward the output end, the adiabatic light guide being configured for concentrating and adiabatically guiding the solar radiation between the input and output ends; and
  a solar cell positioned to receive the solar radiation concentrated by the solar concentrator and to convert the same into electricity.

In accordance with a further aspect of the invention, there is provided a secondary optical element for use in a solar concentrator, the solar concentrator concentrating solar radiation toward a solar cell and including a primary optical element for collecting and focusing the solar radiation, the secondary optical element including:
  an input end for receiving the solar radiation collected and focused by the primary optical element;
  an output end for outputting the solar radiation onto the solar cell; and
  an adiabatic light guide tapering from the input end toward the output end, the adiabatic light guide being configured for concentrating and adiabatically guiding the solar radiation between the input and output ends.

Other features and advantages of embodiments of the invention will be better understood upon reading of preferred embodiments thereof with reference to the appended drawings.

DETAILED DESCRIPTION

Figure 1:
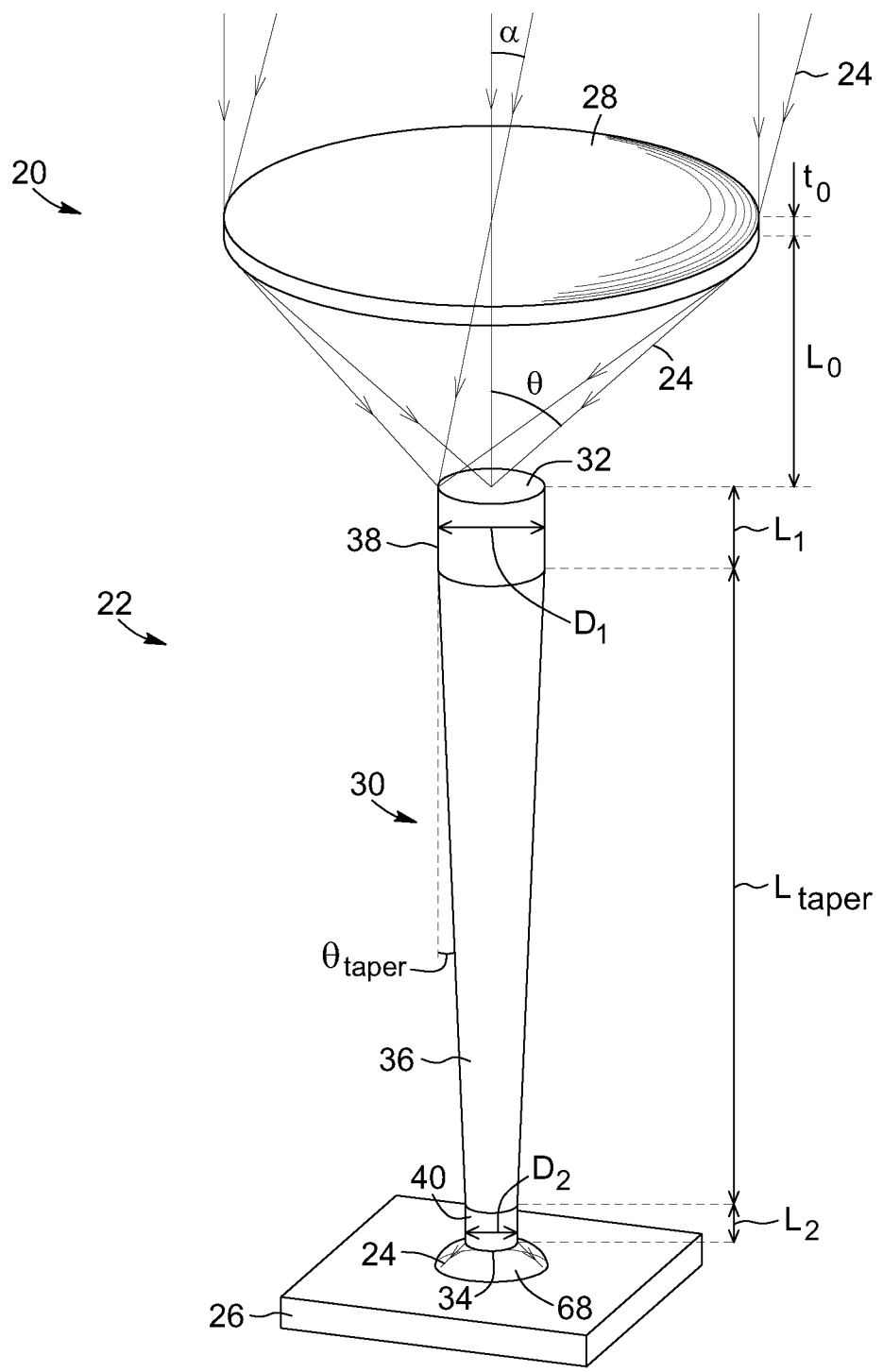
FIG. 1 is a schematic representation of a CPV module including a solar concentrator and a solar cell, in accordance with an embodiment.

In the following description, similar features in the drawings have been given similar reference numerals, and, in order to not unduly encumber the figures, some elements may not be indicated on some figures if they were already identified in preceding figures. It should also be understood herein that the elements of the drawings are not necessarily depicted to scale, since emphasis is placed upon clearly illustrating the elements and structures of the present embodiments.

Embodiments of the present invention generally relate to a solar concentrator for concentrating solar radiation toward a solar cell, to a concentrated photovoltaic (CPV) module equipped with a solar concentrator, as well as to a secondary optical element for use as a component of a solar concentrator.

As defined herein, the terms "solar radiation" and "sunlight" are intended to refer to the total spectrum of electromagnetic radiation emanating from the sun and reaching the Earth. Solar radiation may include radiation with a wavelength ranging from about 280 to 2500 nm, extending across the ultraviolet, visible and infrared portions of the electromagnetic spectrum. Of course, this range of wavelengths is presented only as being typical of solar radiation reaching the Earth and should not be construed as limiting.

Embodiments of the present invention may be useful in solar photovoltaic applications where it is desirable to provide a solar concentrator having a high acceptance angle while maintaining a high concentration factor and optical efficiency.

In the field of solar photovoltaics, the acceptance angle $\alpha$ of a solar concentrator represents the angle at which the solar concentrator, or the CPV system equipped with a solar concentrator, may deviate from a desired alignment with respect to the DNI solar radiation, but still maintains a desired percentage of generated energy efficiency, typically 90%. In other words, the acceptance angle represents the maximum angle at which incoming solar radiation can be captured efficiently by a solar concentrator.

As mentioned above, maximizing or optimizing the acceptance angle of a solar concentrator can be desirable or necessary in practical CPV systems. The acceptance angle of a solar concentrator may be understood as a measure of how precisely the solar concentrator must track the sun in the sky. Thus, a solar concentrator having a lower acceptance angle will generally require a more sophisticated tracking system, which in turn can significantly increase the cost of the overall CPV system. The acceptance angle of a solar concentrator can thus represent a measure of the tolerance of the concentrator to tracking errors.

As also mentioned above, real CPV systems with relatively low acceptance angles generally tend to be more sensitive to other sources of errors and imperfections such as, for example, manufacturing defects, optical aberrations affecting in the system, imperfectly assembled optical components, angular dispersion of DNI solar radiation, deformations due to aging, wind, temperature, gravity and mechanical stress, and the like. The acceptance angle may therefore also be interpreted as a tolerance budget to be spent on all these sources of imperfections It is known that the maximum theoretical acceptance angle $\alpha$ of a solar concentrator is limited by its concentration factor. More specifically, for an ideal solar concentrator, the maximum acceptance angle $\alpha_{max}$ that can be achieved for a given concentration factor $C_g$ obeys the following equation:

$$C_g = \left[n_s \frac{\sin(\theta_{cell})}{\sin(\alpha_{max})}\right]^2, \quad (1)$$

where $\theta_{cell}$ is maximum angle of incidence on the receiver (e.g., a solar cell) and is $n_s$ is the refractive index of the material in which the receiver is immersed.

Figure 4:
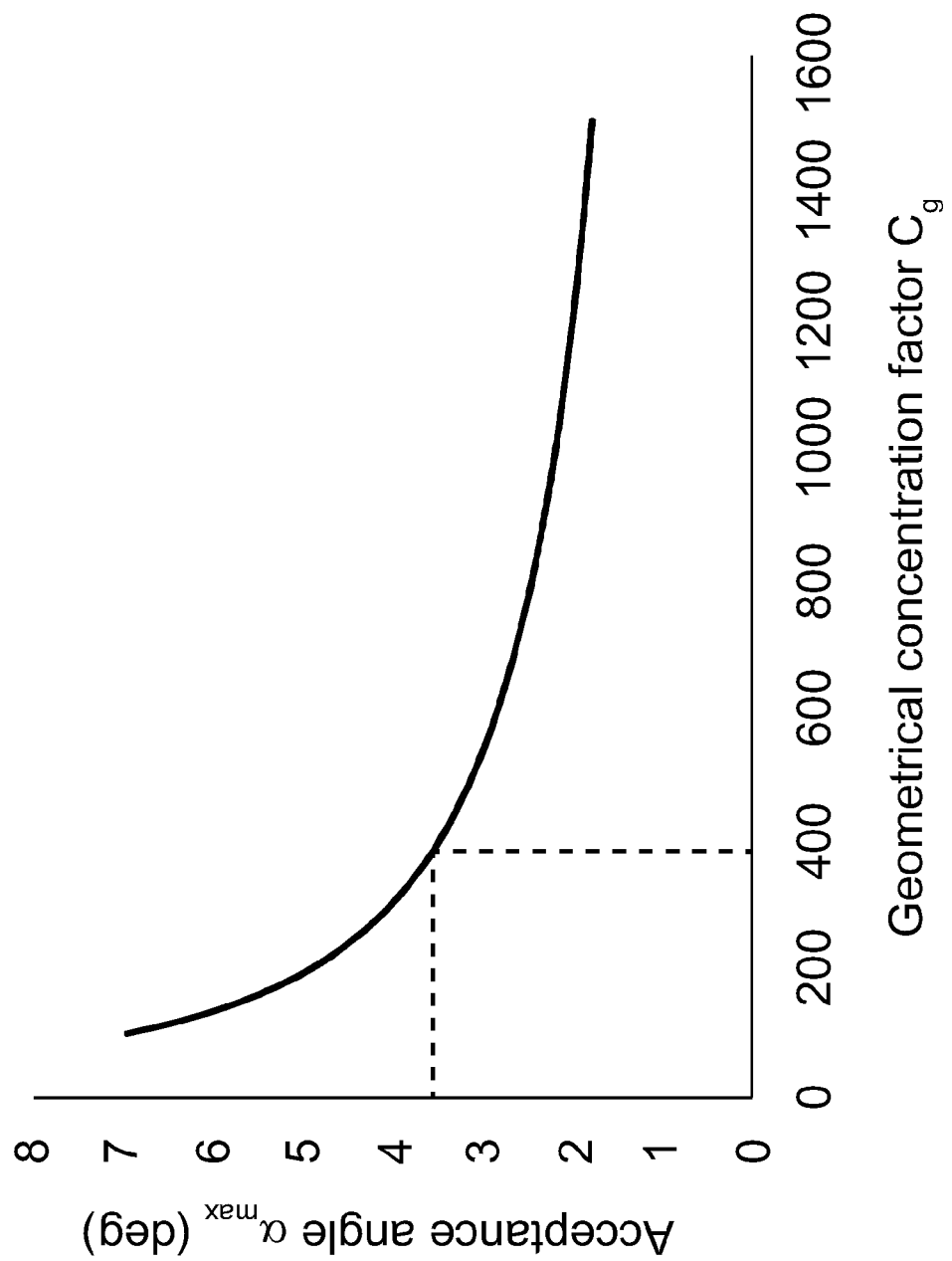
FIG. 4 is graph showing the theoretical maximum acceptance angle of an ideal solar concentrator as a function of the geometrical concentration factor.

FIG. 4 illustrates the variation of the maximum acceptance angle $\alpha_{max}$ of an ideal solar concentrator as a function of the geometrical concentration factor $C_g$ for representative values of $\theta_{cell}$ and $n_s$ (e.g., $\theta_{cell}$=60 degrees and $n_s$=1.4 in FIG. 4). It can be seen that the acceptance angle of a solar concentrator increases as the concentration factor decreases, and vice versa. However, reducing the concentrator factor increases the cost in terms of solar cells. Thus, the final choice of an acceptance angle when designing a solar concentrator generally can involve a combined analysis of the tracking system, the solar cells, and the annual energy gain. Once an optimal concentration factor is selected, it is often desirable to choose or design a solar concentrator that yields an acceptance angle $\alpha$ that is as close as possible to the maximum theoretical value $\alpha_{max}$ shown in FIG. 4.

However, as mentioned above, although currently used CPV systems can achieve various concentration factors, their acceptance angle is typically limited to between about ±0.5 and ±1 degree at concentration factors below 1100 suns. This can lead to significant optical losses and reduced optical efficiency when such CPV systems are used in the field.

Furthermore, solar concentrators with relatively low acceptance angles will generally not allow effective collection of circumsolar radiation. As known in the art, solar radiation can be divided into a direct, a circumsolar and an isotropic diffuse portion. The direct portion, referred to as DNI solar radiation, is collimated at an angle of approximately 0.27 degree (half angle). The circumsolar portion appears to come from a ring immediately around the solar disc, which extends around the DNI solar radiation between angles of approximately ±0.27 and ±3 degrees. The circumsolar radiation can become significant depending on geographic locations and weather conditions. Finally, the isotropic diffuse portion comes substantially equally from all directions in the sky.

First Exemplary Embodiment

Figure 2:
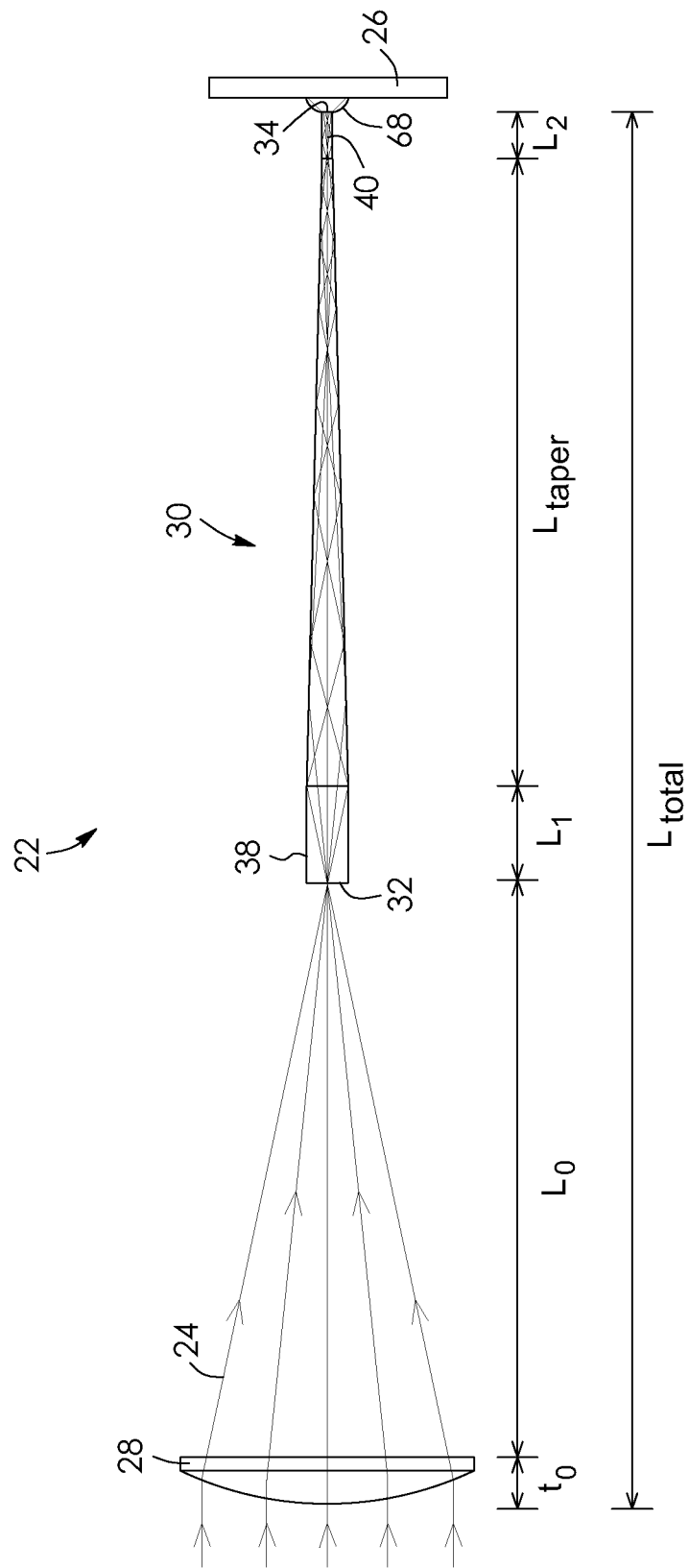
FIG. 2 is a schematic ray-trace representation of the propagation of solar radiation inside the CPV module of FIG. 1.

Referring to FIGS. 1 and 2, a CPV module 20 according to an embodiment is shown. Broadly described, the CPV module 20 includes a solar concentrator 22 for concentrating solar radiation 24 and a solar cell 26 for receiving the solar radiation 24 concentrated by the solar concentrator 22 and converting the same into electricity.

Primary Optical Element

The solar concentrator 22 generally includes a primary optical element 28 and a secondary optical element 30. The primary and secondary optical elements 28 and 30 act, in combination, to collect the solar radiation 24 and concentrate the solar radiation 24 thus collected and concentrated onto the solar cell 26. As will be described below, due to its characteristics and structure, embodiments of the secondary optical element 30 not only can provide a non-negligible contribution to the overall concentration factor of the solar concentrator 22, but can also increase the acceptance angle of the solar concentrator 22 and distribute the solar intensity more uniformly across the light receiving surface of the solar cell 26.

In operation of the CPV module 20, solar radiation 24 enters the solar concentrator 22 through the primary optical element 28, and is subsequently transmitted to the secondary optical element 30. It will be understood that the primary optical element 28 provides a first level of sunlight concentration of the solar concentrator 22. In the illustrated embodiment, the primary optical element 28 is a silicone on glass (SOG) Fresnel lens having a clear aperture $D_0$ of 25 millimeters (mm), a thickness $t_0$ of 4.2 mm and an effective focal length $f_0$ of 50 mm. Of course, these parameters are given for purposes of illustration only and are not meant to be construed as limiting.

Fresnel lenses are commonly used for concentrating solar radiation. They are a type of compact lenses of large aperture and short focal length without the weight and volume of conventional lenses. Fresnel lenses can be produced by dividing a conventional lens into a set of concentric annular sections known as "Fresnel zones". Of course, in other embodiments, the primary optical element 28 may be a Fresnel lens made out of poly(methyl methacrylate) (PMMA), polystyrene or polycarbonate. Alternatively, the primary optical element 28 can be embodied by a conventional lens such as, for example, a convex lens of glass or plastic. It will be understood that when the primary optical element 28 is embodied by a transmissive lens or lenses, the lens or lenses are preferably made of transmissive material in the wavelength range of solar radiation striking the Earth (e.g., in the range from about 280 to 2500 nm). Moreover, in further embodiments, the primary optical element 28 may include reflecting optics (e.g., mirrors), in addition to or in place of refractive optics (e.g., lenses).

Secondary Optical Element

Still referring to FIGS. 1 and 2, the solar concentrator 22 also includes a secondary optical element 30 arranged to receive the solar radiation 24 collected and focused by the primary optical element 28. The secondary optical element 30 includes an input end 32 that receives the solar radiation 24 from the primary optical element 28 and an output end 34 for outputting the solar radiation 24 toward the solar cell 26. In FIGS. 1 and 2, the input end 32 and the output end 34 have circular cross-sections of diameters $D_1$=3.39 mm and $D_2$=0.8 mm, respectively, but other dimensions and shapes could be used in other embodiments without departing from the scope of the present invention. The secondary optical element 30 provides a second level of sunlight concentration of the solar concentrator 22.

In some embodiments, the input end 32 of the secondary optical element 30 is arranged so as to be positioned near the focal plane of the primary optical element 28, so as to benefit from the concentration factor provided by the primary optical element 28. In this regard, it is to be noted that in a CPV module, it is generally desirable to generate a maximum energy rather than to collect a maximum of light. In this regard, it has been found that, due to the specific response of typical multi-junction solar cells used in CPV modules, the point of maximum generated energy is often reached near the focal point of ultraviolet radiation, rather than the conventionally used focal point of visible radiation. In addition, the dispersion of optical materials from which primary and secondary optical elements generally are made is often less important in the infrared portion of solar radiation. In the embodiment of FIGS. 1 and 2, the distance $L_0$ between the planar face of the primary optical element 28 and the input end 32 of the secondary optical element 30 is equal to 47.41 mm, but other values can be used in other embodiments. In particular, one of ordinary skill in the art will recognize that the relative positioning of the first and second optical elements 28, 30 can be varied depending on the spectral response of a given solar cell. Therefore, in other embodiments, the secondary optical element 30 may be arranged so as to be positioned near the focal plane of the primary optical element 28 in different regions of the spectrum of solar radiation.

The secondary optical element 30 also includes an adiabatic light guide 36 tapering from the input end 32 toward the output end 34 at a tapering angle $\theta_{taper}$. The adiabatic light guide 3 is configured for concentrating and adiabatically guiding the solar radiation 24 between the input end 32 and the output end 34. In FIGS. 1 and 2, the adiabatic light guide 36 has a frusto-conical shape, but other shapes could be envisioned in other embodiments, as discussed below.

Throughout the present description, the term "light" when in reference to the adiabatic light guide is understood to refer to electromagnetic radiation (e.g., solar radiation) in any appropriate region of electromagnetic spectrum and is not limited to visible light.

As used herein, the term "adiabatic" is intended to refer to the fact that the tapering of the transverse cross-section of the light guide is sufficiently slow and smooth to ensure adiabatic propagation of solar radiation thereinside. As also used herein, the term "transverse cross-section" refers to the cross-section perpendicular to the optical axis of the adiabatic light guide (or the optical component under discussion). The term "optical axis" refers to an imaginary line defining the path along which light propagates through the adiabatic light guide (or the optical component of system under discussion). Under "adiabatic propagation", the power in each local guided mode is conserved along the light guide. As a result, transmission of an optical signal along the resulting adiabatic light guide can be achieved substantially without radiation loss and mode conversion. As known in the art, adiabatic propagation can be realized when longitudinal variations in the light guide cross-section occur over distances large compared to the wavelength of the guided mode or modes propagating inside the light guide. It will thus be understood that some embodiments of the secondary optical element can be made more tolerant and less sensitive to manufacturing defects and imperfections as a result of the adiabatic nature of the light guide, thus reducing manufacturing costs.

It is known that tapered light guides whose cross-section changes smoothly between the input and output ends become adiabatic as their length tends to infinity or, equivalently, as their tapering angle tends to zero. Advantageously, the adiabatic tapered light guide according to some embodiments can allow concentrating solar radiation with an angular spreading that does not significantly exceeds the theoretical limit set out in Eq. (1), which describes the conservation of etendue.

Furthermore, cross-sectional dimensional variations along the longitudinal extent of an adiabatic light guide may become arbitrarily large as long as the non-uniformities change sufficiently slowly along the length of the light guide. Referring to FIGS. 1 and 2, this means that in the adiabatic regime, the cross-section diameter $D_1$ at the input end 32 of the adiabatic light guide 36 may be several times larger than the cross-section diameter $D_2$ at the output end 34, provided that the tapering angle $\theta_{taper}$ is everywhere sufficiently small. This also means that in the adiabatic regime, a tapered light guide can behave as an ideal or nearly ideal concentrator with geometrical concentration factor proportional to the ratio $(D_1/D_2)^2$ of the cross-sectional areas at the input and output ends of the light guide. For example, in some embodiments, the input and output ends 32, 34 of the secondary optical element 30 can have respective surface areas configured to provide the secondary optical element 30 with a concentration factor of between about 2 and 25. Of course, in other embodiments, the respective surface areas of input and output ends may be outside this range, resulting in different values for the concentration factor, without departing from the scope of the present invention.

Figure 5:
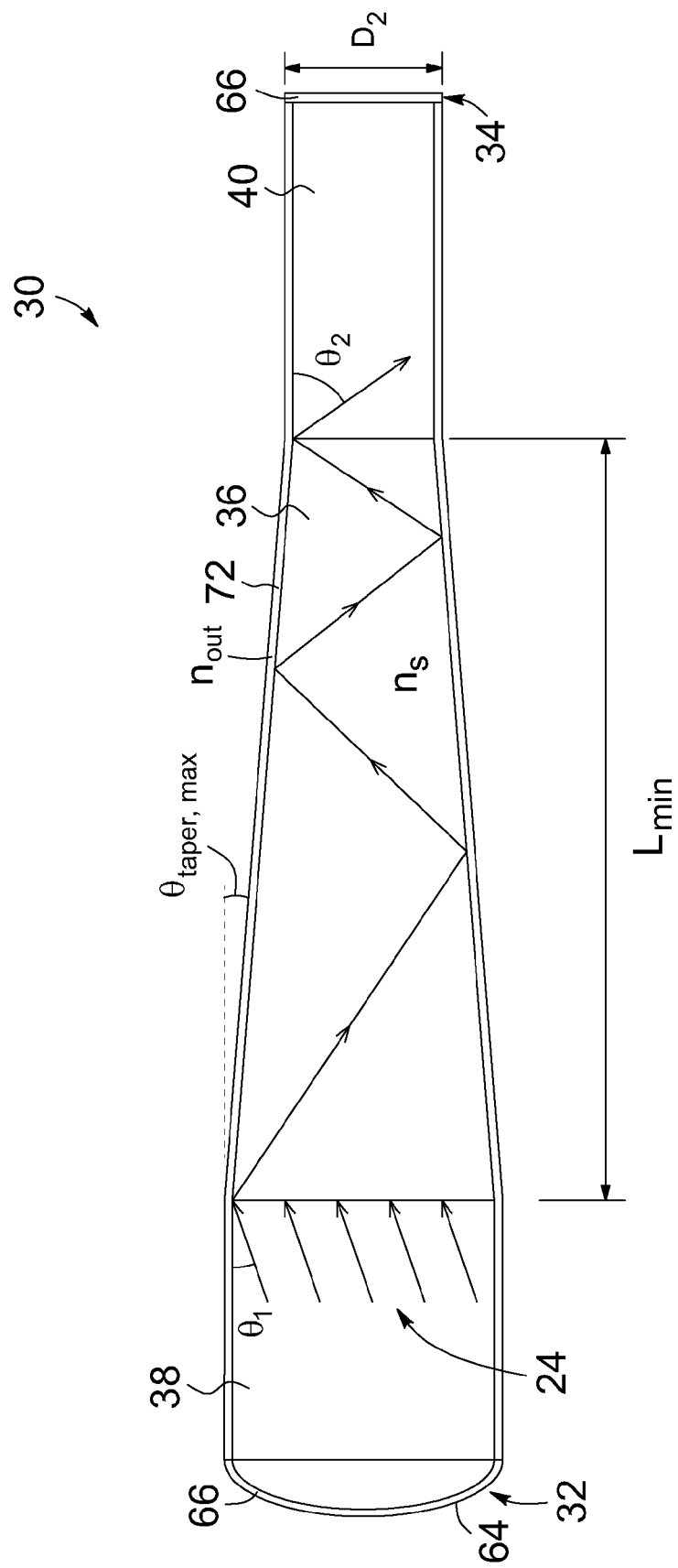
FIG. 5 is a schematic representation of a secondary optical element for use in a solar concentrator, in accordance with an embodiment. The secondary optical element includes an input end, an output end, and an adiabatic tapered light guide.

Referring to FIGS. 2 and 5, the adiabatic tapered light guide 36 can direct the solar radiation 24 by means of total internal reflection of light, so as to confine the solar radiation 24 within the adiabatic light guide 36. As known in the art, total internal reflection occurs when electromagnetic radiation attempting to travel from a medium of high index of refraction to a medium of low index of refraction is incident upon the boundary between the two media at an angle incidence larger than a critical angle. In other words, the critical angle is the angle of incidence above which total internal reflectance occurs. The critical angle $\theta_c$ is given by Snell's law and can be written as:

$$\theta_c = \arcsin\left(\frac{n_{out}}{n_{taper}}\right), \quad (2)$$

where $n_{out}$ is the refractive index of the material in contact with the outside surface of the adiabatic light guide 36 and $n_{taper}$ is the refractive index of the material forming the adiabatic light guide 36. The adiabatic light guide 36 may be used in air (refractive index $n_{out} \approx 1$) or in any other suitable medium. As in FIG. 5, the secondary optical element 30 may also include a cladding 72 disposed on at least a portion of an outer periphery thereof. In such a case, the cladding 72 is made of a material having a refractive index $n_{out}$ lower than the refractive index of the adiabatic light guide $n_{taper}$ to enable total internal reflection.

It is to be understood that although a perfectly adiabatic transition cannot generally be achieved in practice, sufficiently adiabatic conditions can be reached if the tapering angle $\theta_{taper}$ becomes sufficiently small, or equivalently, if the aspect ratio of the taper becomes sufficiently large. For a taper whose cross-section decreases linearly in size from a diameter $D_1$ to a diameter $D_2$, a solution for the minimum taper length $L_{min}$ can be found by solving numerically the following systems of equations [see, e.g., A. W. Snyder and J. D. Love, *Optical Waveguide Theory* (Chapman & Hall, London, 1983)]:

$$L_{min} = \frac{(D_1 - D_2)}{2\tan\theta_{taper,max}}; \quad (3)$$

$$\frac{D_2}{D_1}\frac{\sin(\theta_2 + \theta_{taper,max})}{\sin\theta_1} = 1 + \frac{\tan\theta_{taper,max}}{\tan\theta_1},$$

where the angles $\theta_1$ and $\theta_2$ are illustrated in FIG. 5 and where $\theta_{taper,max}$ is the maximum tapering angle corresponding to the minimum taper length $L_{min}$. It will be understood that in Eq. (3), the two angles $\theta_1$ and $\theta_2$ should not exceed a maximum value in order for total internal reflection to occur in the adiabatic light guide 36.

It is to be noted that providing an adiabatic tapered light guide with a large aspect ratio or, equivalently, a small tapering angle, can ensure or at least makes more probable that the angle of incidence of the solar radiation will not change appreciably between two consecutive internal reflections off the outer peripheral surface of the adiabatic light guide. This, in turn, allows for an increase of the concentration factor that can be provided by the secondary optical element.

Referring back to the embodiment of FIG. 1, the adiabatic light guide 36 has an axial length $L_{taper}$ equal to 54.7 mm, which corresponds to a tapering angle $\theta_{taper}=\arctan[(D_1-D_2)/(2\times L_{taper})]$ equal to 1.36 degrees. Of course, in other embodiments, the length $L_{taper}$ and tapering angle $\theta_{taper}$ of the adiabatic light guide 36 may assume different values, as long as an adiabatic propagation regime is achieved.

Figure 10B:
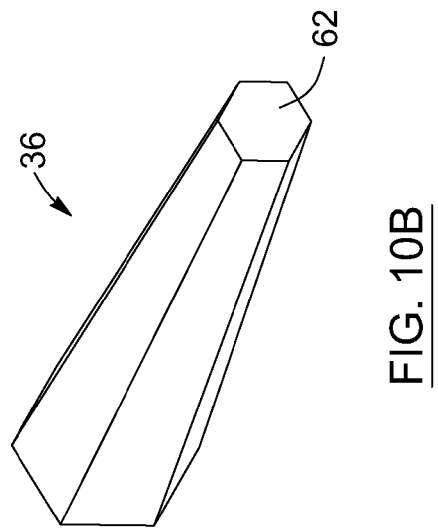
FIGS. 10A to 10D are schematic representations of secondary optical element for use in a solar concentrator, in accordance with embodiments, where the transverse cross-section of the adiabatic light guide of the secondary optical element is square (FIG. 10A), hexagonal (FIG. 10B), elliptical (FIG. 10C) and generally non-circular (FIG. 10D).
Figure 10D:
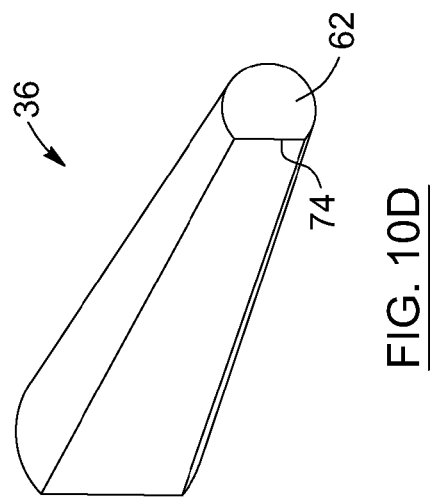
Figure 10A:
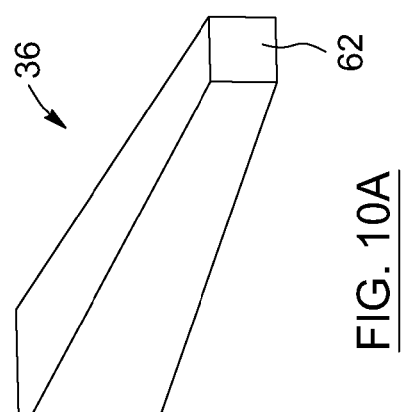
Figure 10C:
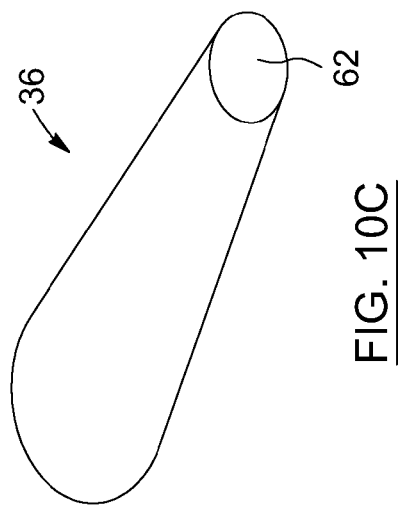

For example, in some embodiments, the adiabatic light guide can have a length $L_{taper}$ of between about 5 mm and 120 mm, preferably between 35 and 70 mm. The length of the adiabatic light guide can be selected, among other factors, according to the solar cell dimensions. Likewise, in some embodiments, the tapering angle $\theta_{taper}$ of the adiabatic light guide 36 can range from about 0.5 to 5 degrees. Of course, these values for $L_{taper}$ and $\theta_{taper}$ are provided for the purpose of illustration and should not be construed as limiting. Furthermore, in other embodiments such as shown in FIGS. 10A to 10D, the transverse cross-section 62 of the adiabatic light guide 36 need not be circular, but may assume other shapes such as square (FIG. 10A), hexagonal (FIG. 10B), elliptical (FIG. 10C) or an arbitrary non-circular shape (FIG. 10D). Additionally, the shape of the transverse cross-section 62 of the adiabatic light guide 36 need not be constant over the entire length of the adiabatic light guide 36, but could be varied in some embodiments, as long as an adiabatic propagation regime is maintained.

In this regard, in some embodiments, it has been found that homogenization of the solar radiation 24 could be increased by reducing the rotational symmetry of the cross-section 62 of the adiabatic light guide 36. Indeed, a light guide with rotationally asymmetrical or non-uniform transverse cross-sections can optimize the homogeneity of propagating light and of light irradiance at the output end of the light guide compared to a light guide with that are rotationally symmetric with respect to the optical axis. For this purpose, it could be advantageous to provide the adiabatic light guide 36 with a non-circular transverse cross-section 62 along at least a portion thereof. For example, in FIG. 10D, the transverse cross-section 62 of the adiabatic light guide 36 includes a flattened portion 74 on an otherwise circular cross-section. Likewise, an adiabatic light guide provided with a square, hexagonal, elliptical or otherwise non-circular or asymmetrical transverse cross-section 62 could also yield homogenization enhancement.

The adiabatic light guide 36 may be made of any suitable low-loss transparent material including, without being limited to, optical glasses such as crown glasses and flint glasses, optical silicon, and optical plastics. For example, in the embodiment of FIGS. 1 and 2, the adiabatic light guide 36 is made of LF5, a light flint optical glass manufactured by Schott and having a refractive index of about 1.58. Of course, the type of glass or transparent material selected as the constituent material of the adiabatic light guide 36 can vary depending on the constraints, particularities, costs, or performance requirements of a given application.

Referring back to FIGS. 1 and 2, the refractive index $n_{taper}$ of the adiabatic light guide 36 will affect the value of the critical angle $\theta_c$ for total internal reflection of the solar radiation 24 which is guided and concentrated inside the adiabatic light guide 36. In turn, the critical angle $\theta_c$ will affect the maximum values allowed for the angles $\theta_1$ and $\theta_2$ in Eq. (3) and, consequently, the minimum taper length $L_{min}$ of the adiabatic light guide 36 as well as its concentrating capabilities.

In the embodiment of FIGS. 1 and 2, the overall geometrical concentration factor $C_g$ of the solar concentrator 22 is equal to $$C_g = C_{g1} \times C_{g2} = \left(\frac{D_0}{D_1}\right)^2 \times \left(\frac{D_1}{D_2}\right)^2 = \left(\frac{D_0}{D_2}\right)^2 \approx 976\times, \quad (4)$$

where $C_{g1}=(D_0/D_1)^2 \approx 54\times$ is the concentration factor provided by the primary optical element 28 and $C_{g2}=(D_1/D_2)^2 \approx 18\times$ is the concentration factor provided by the adiabatic light guide 36 of the secondary optical element 30. It will be understood that because of the multiplicative nature of concentration factors, the solar concentrator 22 according to some embodiments can achieve large overall concentration factors $C_g$ even when the concentration factors $C_{g1}$ and $C_{g2}$ of the primary and secondary optical elements 28 and 30 have moderate values. For example, in some embodiments the overall geometrical concentration factor $C_g$ of the solar concentrator 22 can range from about 500 to 2500, more particularly between about 1000 and 1800, and further particularly between 1000 and 1100. Of course, these values are provided for illustrative purposes and should not be construed as limiting.

Figure 7:
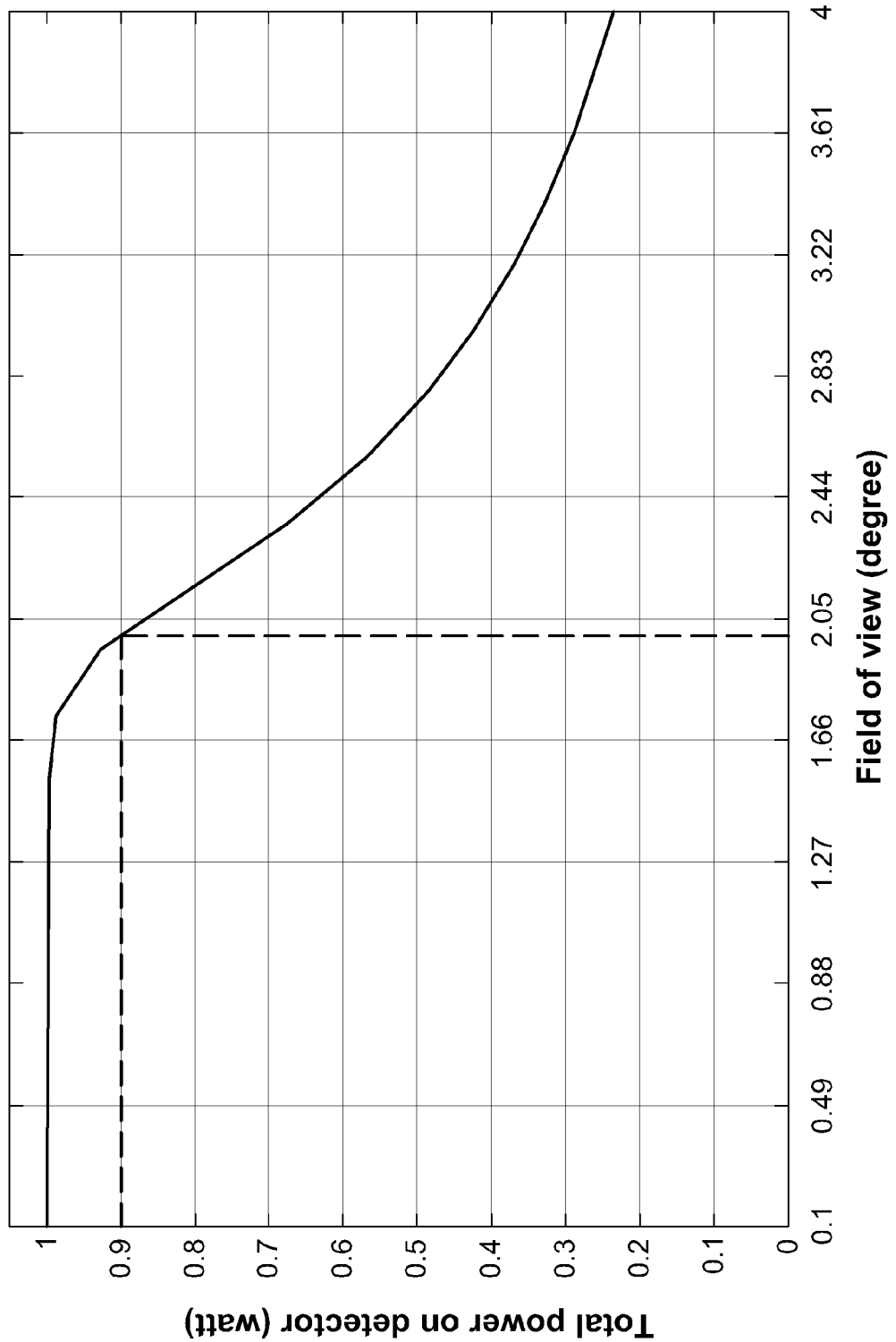
FIG. 7 is graph showing an optical simulation of the optical transmission of the solar concentrator shown of FIG. 2 as a function of the field of view of the solar concentrator for an incident collimated beam.

In addition to contributing to the overall concentration factor $C_g$ of the solar concentrator 22, some embodiments of the secondary optical element 30 with the adiabatic tapered light guide 36 can increase the acceptance angle α of the solar concentrator 22 while maintaining high optical efficiency. In particular, FIG. 7 is an optical simulation of the optical transmission of the embodiment of the solar concentrator shown in FIGS. 1 and 2 as a function of the field of view thereof. It is seen that the acceptance angle α of this embodiment of the CPV module 20 is about ±1.9 degrees.

The adiabatic and low-loss nature of the light guide can have a homogenizing effect on the solar radiation propagating therealong and, thus, on the irradiation distribution on the solar cell. This can be explained by the fact that an adiabatic light guide is generally less sensitive to the presence of defects and imperfections and that the presence of such defects and imperfections can, in turn, contribute to improving the homogenization of solar radiation at the output end of the secondary optical element. As a result, some embodiments of the secondary optical element 30 can improve the spatial uniformity of the distribution of solar radiation 24 reaching the solar cell, thereby increasing their efficiency.

Another desirable characteristic of some embodiments of the adiabatic light guide is that they can exhibit good optical transmission over a large wavelength range. This can be advantageous in the case of solar concentrators due to the relatively broad spectrum of solar radiation. Some embodiments of the secondary optical element can output the solar radiation with a uniform beam profile (e.g., square-like) where the different spectral components (e.g., infrared, visible and ultraviolet components) are well mixed together so as to optimize the output power generation of the solar cell. In particular, optical simulations have been performed and have demonstrated that some embodiments of the secondary optical element can produce highly homogenous beam profile and high level of color mixing at the output end thereof.

Some embodiments of the secondary optical element can also provide an improved uniformity of solar radiation over a range of incidence angles lying with the cone defined by the acceptance angle of the solar concentrator.

Still referring to FIGS. 1 and 2, the secondary optical element 30 may optionally include straight input and output sections 38, 40 at the input and output ends 32, 34 thereof. By the term "straight", it is meant that the cross-section of the input and output sections 38, 40 of the secondary optical element 30 remains substantially constant over their respective lengths $L_1$ and $L_2$. In FIGS. 1 and 2, $L_1$=8 mm and $L_2$=4 mm, but other dimensions could be used in other embodiments. Hence, the total length $L_{total}=t_0+L_0+L_1+L_2+L_{taper}$=118.31 mm in FIGS. 1 and 2. It will be understood that in the embodiment of FIGS. 1 and 2, the solar radiation 24 focused by the primary optical element 28 enters inside the secondary optical element 30 through the input end 32 thereof. The solar radiation 24 then propagates successively by total internal reflection along the straight input section 38, the adiabatic light guide 36, and the straight output section 40. The solar radiation 24 can finally be outputted by the output end 34 as concentrated and homogenized solar radiation 24 and is directed toward the solar cell 26 where it can be converted into electricity.

In FIGS. 1 and 2, the transverse cross-section of the output sections 38, 40 are circular in shape, with diameters equal to $D_1$ and $D_2$, respectively. It will be understood that the straight input section 38, the adiabatic light guide 36 and the straight output section 40 of the secondary optical element 30 are preferably integrally formed as a single unit of transparent material, for example a suitable optical glass or plastic, for collecting, adiabatically guiding, concentrating and/or homogenizing the solar radiation 24 collected and concentrated by the primary optical element 28. In the embodiment of FIGS. 1 and 2, the whole secondary optical element is made from a single piece of LF5 glass. Of course, in other embodiments, different materials such as, for example, optical grade silicon could be used.

The straight input section 38 at the input end 32 of the secondary optical element 30 can act as a homogenizer and further improve the uniformity of the irradiation distribution of the concentrated solar radiation 24 reaching the solar cell 26 after having propagated inside the secondary optical element 30. In addition, because the cross-section of the straight input section 38 is substantially constant and not tapered, the first total internal reflections of the solar radiation 24 inside the secondary optical element 30 can occur with smaller deviation angles, thereby increasing the overall acceptance angle of the solar concentrator 22.

It is to be noted that regardless of whether or not a straight input section 38 is provided at the input end 32 of the secondary optical element 30, the input end 32 need not be a flat surface, as illustrated in FIG. 1. For example, in some embodiments such as in FIG. 5, the input end 32 of the solar concentrator 22 can have a convex or dome-shaped surface 64. The provision of such a convex or dome-shaped surface 64 can allow for the use of an adiabatic tapered light guide 36 with a smaller entrance diameter and a smaller length.

The straight output section 40 at the output end 34 of the secondary optical element 30 can be useful in some embodiments where it is desirable to direct the output of more than one secondary optical element 30 on the same solar cell 26 or to guide the solar radiation 24 over a longer distance.

In this regard, the provision of a straight output section at the output end of the secondary optical element may be useful in some embodiments where it is be desirable that the solar radiation concentrated by a plurality of solar concentrators, each including an adiabatic tapered light guide as described herein, be directed onto the same solar cell. In such embodiments, the straight output section of the secondary optical element of each solar concentration would act as a light guide or an optical fiber for guiding the concentrated solar radiation onto the solar cell. However, the provision of a straight output section may not be necessary in some embodiments where the output end of the secondary optical element faces directly the receiving surface of the solar cell.

Still referring to FIG. 5, in some embodiments of the secondary optical element 30, an antireflection coating 66 may be deposited on at least one of the input and output ends 32, 34 in an attempt to reduce optical losses due, for example, to Fresnel reflections that can occur at the input end 32 of the secondary optical element 30. The antireflection coating 66 may be composed of one or multiple layers of various optical materials. In single-layer coating, a material having a refractive index less than that of the material of the secondary optical element 30 can be used. Various polymeric transparent materials, optical glasses, materials based on nanoparticles or porous materials can be used for this purpose. It will be understood that the presence of such a low refractive index material can reduce reflection losses.

Single-layer antireflection coating can act as well as an interferential antireflection coating. For certain combinations of thickness and refractive index it may be possible to achieve a reflection reduction due to interferences occurring at the interfaces between air (or another outside medium) and the antireflection coating 66 and between the antireflection coating 66 and the secondary optical element 30. This interferential principle can be improved when a stack a multiple layers of various thicknesses and indices of refraction are deposited on the secondary optical element.

In other embodiments, an antireflection coating 66 may be embodied by a layer composed from a surface relief grating, having a grating period smaller than the smallest wavelength of the incident beam of solar radiation. For example, for solar radiation, the grating period may be selected to be smaller than 280 nm. In yet other embodiments, an antireflection coating such as described above can be alternatively or additionally be deposited on the output end 34 of the secondary optical element 30.

Solar Cell

Still referring to FIGS. 1 and 2, the CPV module 20 also includes a solar cell 26. The solar cell 26 is positioned to receive the solar radiation 24 concentrated by the solar concentrator 22 and to convert the same into electricity. In some embodiments, the solar concentrator 22 is positioned as close as possible above the solar cell 26. For example, in one embodiment, the distance between the output end 34 of the secondary optical element 30 and the solar cell 26 may be less than 50 micrometers (μm).

In some embodiments, the CPV module can also include an optically transparent gel-based material 68 bridging a gap and providing an optical contact between the output end 34 of the secondary optical element 30 and the solar cell 26. The optically transparent gel-based material 68 can be, for example, a silicone gel inserted in the gap between the output end 34 of the secondary optical element 30 and the solar cell 26 to ensure direct contact therebetween while minimizing optical losses that could arise if the concentrated solar radiation 24 exiting the secondary optical element 30 were to travel through air before reaching the solar cell 26. In some embodiments, the provision of a high-viscosity gel-based optically transparent material 68 could also improve the mechanical stability of the CPV module 20 by maintaining the secondary optical element 30 in place and by acting as a shock and/or vibration absorber.

The solar cell 26 may be a single-junction or a multi-junction thin film solar cell. For example, the solar cell 26 may be a multi-junction solar cell based on III-V compound semiconductors. As known in the art, multi-junction solar cells can be formed of stacked layers of photovoltaic materials on a substrate, for example germanium. Each layer of photovoltaic material generally has a different energy gap and is tailored for efficient conversion to electrical energy of photons of a specific energy range. In principle, however, any type of solar cell known in the art could be suitable for use in embodiments of the CPV module 20, including thin film solar cells such as a-Si, CdTe or CIGS (copper indium gallium selenide) based solar cells, as well as organic solar cells.

Currently used multi-junction solar cells generally have a cell size ranging from about 0.6 mm×0.6 mm to about 10.0 mm×10.0 mm, but could be used in a variety of other larger and smaller sizes. In addition, conventional multi-junction solar cells can assume different shapes, including, without limitation, square, hexagonal or circular. For example, in some non-limiting embodiments, the solar cell can have lateral dimensions of between about 100 μm and 10 mm. When referring to a solar cell, the term "lateral dimension" refers to a dimension of a solar cell that lies in the plane of the light receiving surface of the solar cell. Typical lateral dimensions of a solar cell include, without being limited to, a length, a width, a radius, a diameter, and the like.

It will be understood that in the embodiment described above and illustrated for example in FIGS. 1 and 2, the components of the CPV module 20 have dimensions similar to those of commercial CPV modules. However, due at least partly to the adiabatic nature of the light guide, different embodiments of the secondary optical element could be readily combined with various types of primary optical elements, including Fresnel lenses as described above but also conventional lenses made of glass, plastics or assembled into SOG structure, as well as primary optical elements based on reflective optics.

Moreover, the secondary optical element according to embodiments of the invention is versatile and can tailored for use in combination with primary optical elements in order to design solar concentrators whose concentration factors and acceptance angles can be customized over a wide range of values. It will also be understood that the adiabatic nature of the light guide makes the secondary optical element scalable to smaller dimensions. This can be understood, for example, by considering Eq. (3), from which it can be found that the minimum taper length $L_{min}$ of the adiabatic light guide 36 decreases substantially proportionally with its transverse dimensions $D_1$ and $D_2$.

More specifically, an advantageous aspect of some embodiments of the invention is that the dimensions of the adiabatic light guide provided in the secondary optical element can be varied while maintaining the adiabatic nature of the light guide. This flexibility in designing the dimensions of the adiabatic light guide and thus, the optical properties of the overall CPV module, can be utilized in different ways. Exemplary and non-limiting methods of exploiting the scalability of the adiabatic light guide according to some embodiments will now be discussed Firstly, in some embodiments, the length of the adiabatic light guide could be increased or decreased while maintaining the same concentration factor within the light guide (e.g., by adjusting the value of the tapering angle), the same dimensions for the primary optical element and the same dimensions for the solar cell. Such designs would provide a control over the homogeneity and the fill factor of the solar radiation exiting the adiabatic light guide at the output end of the secondary optical element.

Secondly, in other embodiments, the length of the adiabatic light guide could be maintained to a fixed value while increasing or decreasing the concentrator factor provided by the secondary optical element so as to vary the acceptance angle of the system of the CPV module.

Thirdly, the dimensions of the adiabatic light guide can be optimized for a wide variety of CPV modules of different sizes. More specifically, for a CPV module of a given concentration factor, the length and the tapering angle of the adiabatic light guide could be increased or decreased in order to tailor the acceptance angle of the system, as well as and the homogeneity and fill factor of the concentrated solar radiation exiting the output end of the secondary optical element.

It is to be noted that in the above exemplary non-limiting scenarios, the adiabatic nature of the light guide is preserved, while other factors like the acceptance angle, homogeneity and fill factor of the solar radiation exiting the output end of the light guide can be customized according to the particularities or requirements of a given CPV system.

In view of the above considerations, it will be understood that in some embodiments of the invention, the provision of a solar concentrator equipped with a secondary optical element supporting adiabatic propagation opens the way to the design and manufacture of miniaturized CPV modules. By way of example, the size of the solar concentrator according to some embodiments of the invention could be reduced for use with a solar cell having a size similar to the size of a light-emitting diode (LED) die or chip in a conventional LED package, that is, a solar cell with lateral dimensions as small as a few micrometers.

Second Exemplary Embodiment

Figure 3:
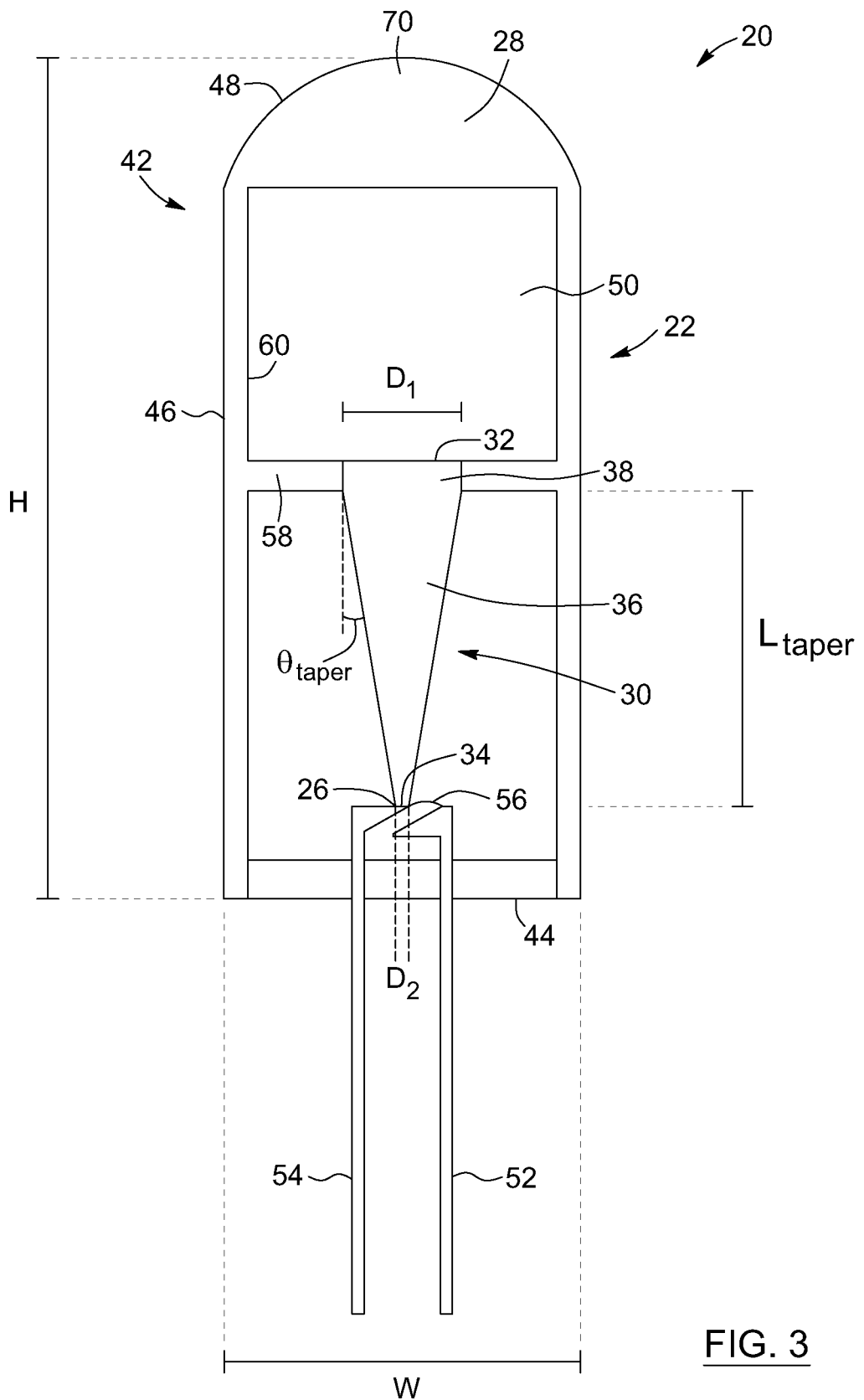
FIG. 3 is a schematic representation of a CPV module including a solar concentrator and a solar cell, in accordance with another embodiment.

Referring now to FIG. 3, there is shown a CPV module 20 according to another embodiment of the invention. As for the embodiment discussed above with reference to FIGS. 1 and 2, the CPV module 20 shown in FIG. 3 includes a solar concentrator 22 for concentrating solar radiation and a solar cell 26 for receiving the solar radiation concentrated by the solar concentrator 22 and converting the concentrated solar radiation 24 into electricity. In FIG. 3, the concentration factor $C_g$ of the solar concentrator 22 is equal to about 1000×. However, it will be understood that the solar concentrator 22 could have different values of concentration factor $C_g$ in other embodiments. The solar concentrator 22 includes a primary optical element 28 for collecting and focusing the solar radiation and a secondary optical element 30 including an adiabatic light guide 36.

In the embodiment of FIG. 3, the CPV module 20 forms a fully encapsulated packaged structure. The CPV module 20 includes a housing 42 enclosing the secondary optical element 30 and the solar cell 26, the housing comprising an optically transparent window 70 corresponding at least in part to the primary optical element 28. The housing 42 can include a base 44, a cylindrical peripheral side wall 46 and a dome-shaped top portion 48, which together define a cavity 50 inside the housing 42. It will be understood that the optically transparent window 70 occupies at least part of the dome-shaped top portion 48 of the housing 42.

In the embodiment of FIG. 3, the resulting encapsulated CPV module 20 has a height H of 22 mm and a width W of 8 mm, and is therefore much smaller than conventional commercial CPV modules having dimensions such as those of the embodiment of FIGS. 1 and 2. Of course, the dimensions in FIG. 3 are provided for illustrative purposes only and could be different in other embodiments. The encapsulated CPV module 20 may further include an anode 52 and a cathode 54 electrically coupled to the solar cell 26, the anode 52 and the cathode 54 being configured to supply the electricity generated by the solar cell to external circuitry (not shown). For example, the solar cell 26 can be coupled to the cathode 54 via a thermally and electrically conductive epoxy, and to the anode 52 via wire bonding 56. The anode 52 and cathode 54 can protrude from the base 44 of the housing 42 of the encapsulated CPV module 20 and function as connecting terminals of the encapsulated CPV module 20 for electrical connection with external circuitry (not shown).

Additionally, the encapsulated CPV module 20 may include a support member 58 provided inside the housing 42 and holding the secondary optical element 30 in place with respect to the solar cell 26. The support member 58 can include a first end connected to an inner surface 60 of the cylindrical peripheral side wall 46 of the housing and a second end connected to the secondary optical element 30 at the input end 32 thereof, for example to the straight input section 38 of the secondary optical element 30

As will be understood from FIG. 3, the optically transparent window 70 on the dome-shaped top portion 48 of the housing 42 can define a plano-convex lens and corresponds, at least in part, to the primary optical element 28 of the solar concentrator 22. However, in other embodiments, the housing 42 could be provided with a flat-shaped top portion 48. In such cases, the primary optical element 28 of the solar concentrator 22 could be embodied by a SOG lens or suitable optics. As mentioned above, solar radiation 24 is incident onto the primary optical element 28 and received and focused by the same toward the secondary optical element 30 disposed inside the housing 42. The primary optical element 28 provides a first level of sunlight concentration of the solar concentrator 22. The primary optical element 28 may be made of a suitable transparent material such as optical glasses (e.g. silicon) and optical plastics (e.g. PMMA).

As also discussed above, the secondary optical element 30 is arranged to receive the solar radiation 24 collected and focused by the primary optical element 28. The secondary optical element 30 includes an input end 32 for receiving the solar radiation 24 from the primary optical element 28, an output end 34 for outputting the solar radiation onto the solar cell 26, and an adiabatic light guide 36 tapering from the input end 32 toward the output end 34 and configured for concentrating and adiabatically guiding the solar radiation 24 between the input and output ends 32, 34. In FIG. 3, the input and the output ends 32, 34 have circular cross-sections of diameters 0.77 mm and 0.25 mm, respectively. Of course, other dimensions and shapes could be used in other embodiments.

The adiabatic light guide 36 can be configured for concentrating and adiabatically guiding the solar radiation 24 between the input and output ends 32, 34 by means of total internal reflection. As the adiabatic light guide 36 in FIG. 3 corresponds essentially to a scaled-down version of the adiabatic light guide 36 described above and shown in FIGS. 1 and 2, one of ordinary skill in the art will understand that the above considerations regarding the optical properties and material composition of the adiabatic light guide 36 of FIGS. 1 and 2 remain valid for the adiabatic light guide of FIG. 3. In particular, the tapering angle of the adiabatic light guide 36 of FIG. 3 is preferably sufficiently small to ensure adiabatic propagation of solar radiation thereinside. More specifically, in FIG. 3, the adiabatic light guide 36 has a length $L_{taper}$=9 mm, a cross-section diameter $D_1$=0.77 mm at the input end 32 and a cross-section diameter $D_2$=0.25 mm at the output end 34, such that the tapering angle $\theta_{taper}$ is equal to 3.3 degrees.

In addition the ability of enhancing the concentration factor $C_g$ of the solar concentrator 22, embodiments of the secondary optical element 30 provided with an adiabatic tapered light guide 36 can increase the acceptance angle α of the solar concentrator 22 while maintaining high optical efficiency. Moreover, as a result of its adiabatic and low-loss nature, the adiabatic light guide 36 of FIG. 3 can also act as a homogenizer on the solar radiation propagating therealong by improving the spatial uniformity over the solar cell 26 of the irradiation distribution of the solar radiation 24 outputted by the secondary optical element 30.

In the embodiment of FIG. 3, the secondary optical element 30 includes a straight input section 38 at the input end 32 thereof. In other embodiments, the secondary optical element 30 could also include a straight output section 40 at the output end 34 thereof, as in FIGS. 1 and 2. In FIG. 3, the straight input section 38 and the adiabatic light guide 36 are preferably made from a single piece of transparent material, for example an optical glass or optical plastic. As mentioned above, the straight input section 38 may be used to further improve the uniformity of the irradiation distribution of the concentrated solar radiation 24 that reaches the solar cell 26 after having propagated inside the secondary optical element 30.

Also, because the cross-section of the straight input section 38 is substantially constant and not tapered, the first reflections of the solar radiation 24 inside the secondary optical element 30 can occur with smaller deviation angles, thereby increasing the overall acceptance angle of the solar concentrator 22. Furthermore, as mentioned briefly above, the straight input section 38 can provide the contact point of the secondary optical element 30 with the support member 58, thus avoiding contact with the adiabatic light guide 36, which could otherwise adversely affect its optical efficiency and thus the acceptance angle and optical losses of the overall solar concentrator 22.

Still referring to FIG. 3, the encapsulated CPV module 20 also includes a solar cell 26 positioned proximate the output end 34 of the secondary optical element 30 for receiving the solar radiation 24 concentrated by the solar concentrator 22 and converting the same into electricity. The solar concentrator 22 may be positioned as close as possible above the solar cell 26. For example, in one embodiment, the distance between the output end 34 of the secondary optical element 30 and the solar cell 26 may be less than 50 µm. Moreover, an optically transparent gel-based material (not shown in FIG. 3; see for example FIG. 1) bridging a gap and providing an optical contact between the output end 34 of the secondary optical element 30 and the solar cell 26. The optically transparent gel-based material can be, for example, a silicone gel inserted in the gap between the output end 34 of the secondary optical element 30 and the solar cell 26 to ensure direct contact therebetween while minimizing optical losses that could arise if the concentrated solar radiation 24 exiting the secondary optical element 30 were to travel through air before reaching the solar cell 26. In some embodiments, the provision of a high-viscosity gel-based optically transparent material could also improve the mechanical stability of the CPV module 20 by maintaining the secondary optical element 30 in place and by acting a shock and/or vibration absorber.

The solar cell 26 may be a single-junction of a multi-junction thin film solar cell, for example a multi-junction solar cell based on III-V compound semiconductors. In FIG. 3, the solar cell 26 has a size of 250 µm×250 µm, but other dimensions could be used without departing from the scope of the invention. For example, a solar cell 26 having a size as small as 125 µm×125 µm, which corresponds to the smallest size attainable in commercial LED dies, could be envisioned. In such a case, the dimensions of the solar concentrator 22 and the housing 42 of the encapsulated CPV module 20 would be scaled down accordingly.

Experimental Measurements

Experimental measurements illustrating the acceptance angle enhancement capabilities that can be provided by some embodiments of the present invention will now be described. One of ordinary skill in the art will understand that the present invention is not limited to this particular experimental demonstration.

The experimental acceptance angle measurements were performed with a home-built CPV module mounted on a high-precision tracking system (angular precision of less than ±0.05 degree). The CPV module used for the measurements is similar to the one shown in FIGS. 1 and 2. In particular, the CPV module includes a solar concentrator provided with a primary optical element and a secondary optical element that includes an adiabatic tapered light guide. As mentioned above, the provision of the adiabatic tapered light guide in the secondary optical element can provide: (i) an increase of the overall concentration factor; (ii) an increase in the acceptance angle; and (iii) an improved uniformity of the irradiation distribution of the solar radiation at the output of the solar concentrator.

The measurements were conducted in the region of Quebec City, Quebec, Canada, between March and May 2012. The sun radiation power was constantly detected by two identical pyrometers. The first pyrometer was used to measure the DNI and circumsolar components of the solar radiation, while the second pyrometer was used to measure the isotropic diffuse solar radiation. In order to characterize the optical performances of the CPV modules, that is, to measure the power of the concentrated solar radiation at the output of the secondary optical element, the short current generated by a multi-junction solar cell was monitored. This technique of measuring the acceptance angle of a CPV system is well known in the art.

Figure 6:
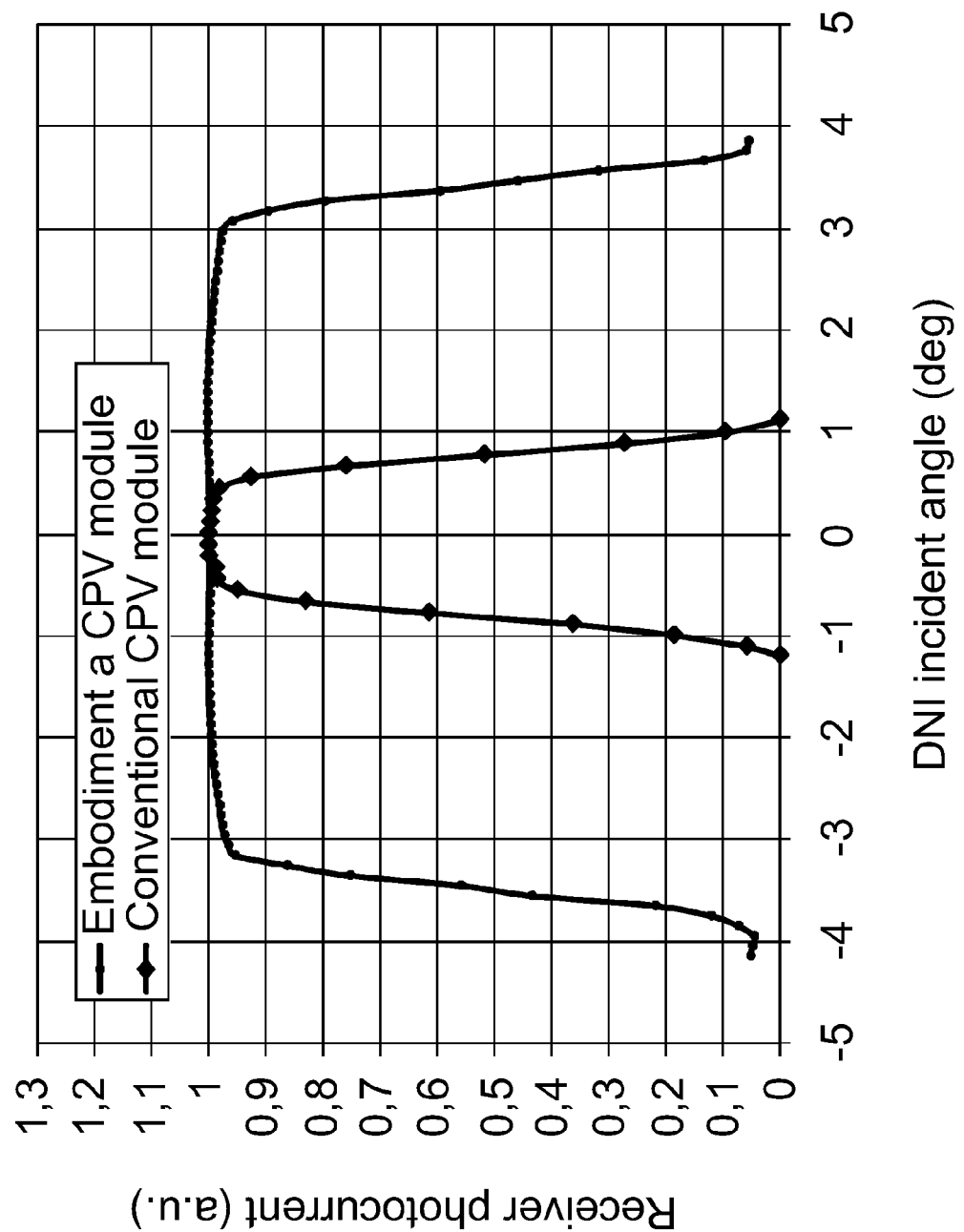
FIG. 6 shows experimental data comparing the optical efficiency in transmission as a function of the incidence angle of the DNI solar radiation of a CPV module according to an embodiment with that of a conventional CPV module.

Referring now to FIG. 6, experimental data of the optical efficiency as a function of the incidence angle of the DNI solar radiation for a CPV module according to an embodiment is provided. The CPV module has a concentrator factor of 380×. Data of the optical efficiency of a conventional CPV module is also provided for comparison purposes. It will be understood that in FIG. 6, the optical efficiency of the CPV module is proportional to the photocurrent generated by the multi-junction solar cell. It can be seen that the generated energy remains almost constant until the CPV module was rotated from its initial position by more an angle of more than ±3.2 degrees, at which point the transmission of the CPV module fell abruptly. Such a behavior is indicative of a well-designed solar concentrator, otherwise a more bell-like transmission curve would have been observed. The solar concentrator according to this embodiment thus exhibits an acceptance angle of about ±3.2 degrees, which is significantly larger than the acceptance angle that can be achieved using existing CPV modules, whose acceptance angle generally does not exceed ±1 degree. The demonstrated acceptance angle of ±3.2 degrees is also close to the maximum theoretical value of ±3.6 degrees expected from Eq. (1) and indicated in FIG. 4.

Figure 8:
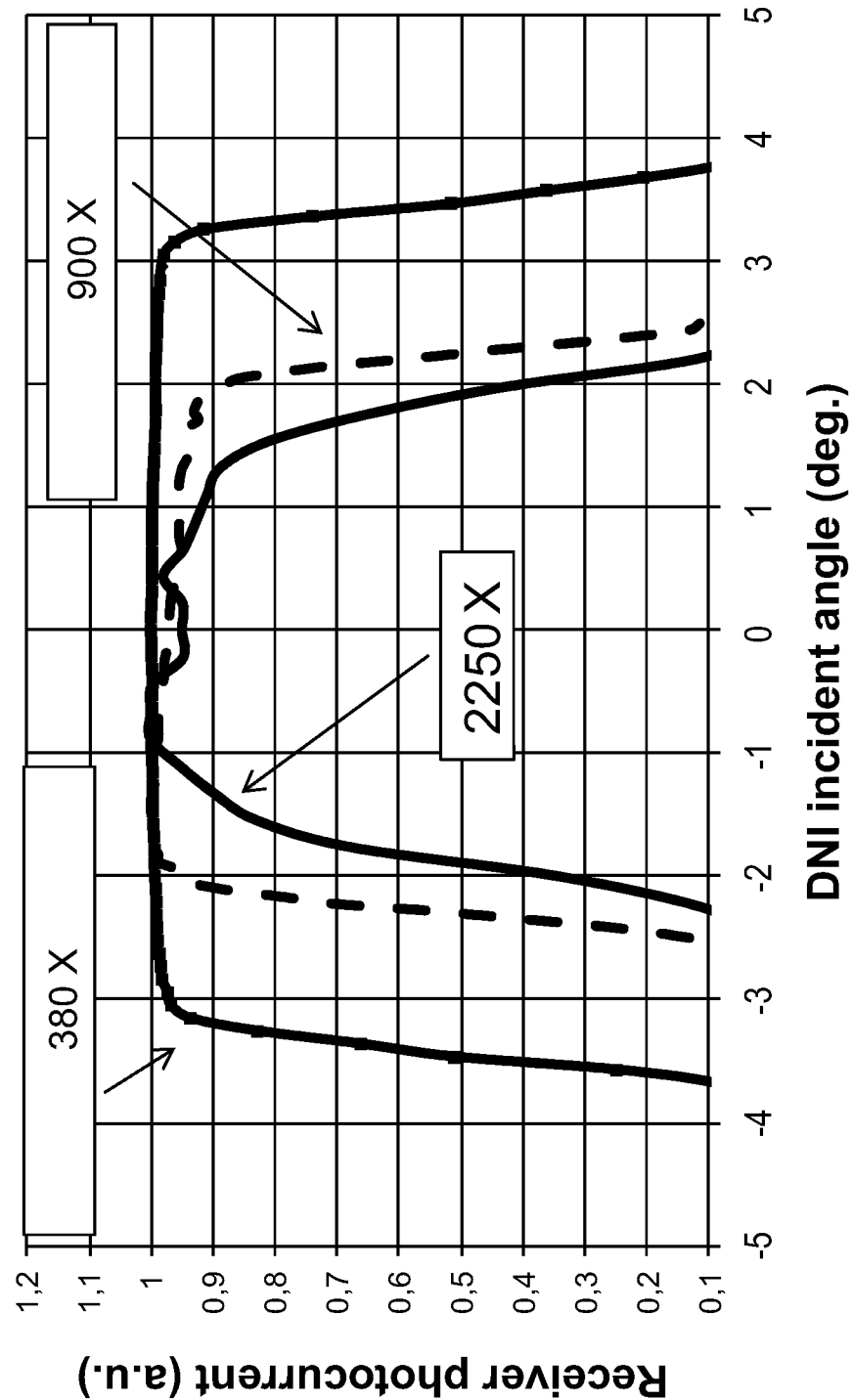
FIG. 8 shows experimental data of the optical efficiency in transmission as a function of the incidence angle of the DNI solar radiation for CPV modules according to three embodiments.

Referring now to FIG. 8, experimental measurements were also performed to compare the acceptance angle of CPV modules with different concentration factors. More specifically, FIG. 8 shows experimental data of the optical efficiency in transmission as a function of the incidence angle of the DNI solar radiation for CPV modules according to three embodiments. Each of the three CPV modules includes a solar concentrator provided with an adiabatic light guide such as described above. The concentration factors of the three CPV modules are 380× (i.e., as for the CPV module of FIG. 6), 900× and 2250×.

From FIG. 8, it can be seen that the acceptance angles for the CPV modules with concentration factors of 380×, 900× and 2250× are about ±3.2, ±1.9 and ±1.2 degrees, respectively. These values are close to the theoretical values of ±3.6, ±2.1 and ±1.46 degrees given by Eq. (1). As mentioned above, for the embodiment with a concentration factor of 380×, the generated current was almost constant until the concentrator was misaligned with respect to its initial position by more than 3.2 degrees (half-angle), at which point the transmission of the CPV modules fell abruptly. A similar behavior is observed for the embodiment with a concentration of 900×, where again, the angular response exhibits a square-like profile. Finally, in the case of the embodiment with a concentration factor of 2250×, while the squareness of the response is decreased, the value of the acceptance angle remains close to the theoretical value. It is to be noted that because Eq. (1) assumes perfectly collimated light, the slight difference between experiment and theory may be explained, at least in part, by the small angular divergence of DNI solar radiation.

Figure 9:
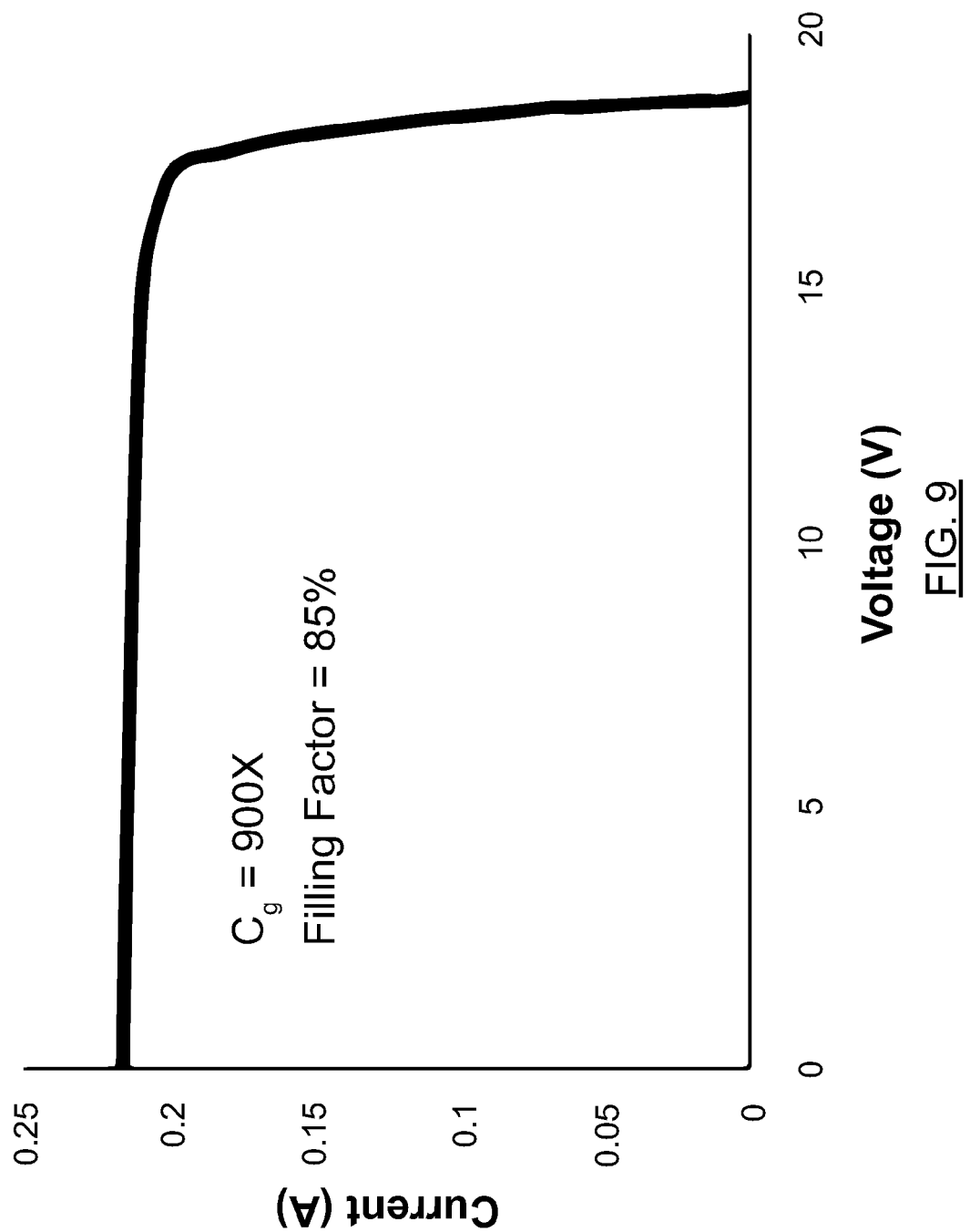
FIG. 9 shows an experimental current-voltage (I-V) curve of a CPV module with a concentration factor of 900×, in accordance with an embodiment.

Referring to FIG. 9, a typical current-voltage (I-V) curve of an embodiment of a CPV module with concentration factor of 900× is presented. The illustrated I-V curve indicates that the fill factor of the CPV module is more than 85%, which compares advantageously with the highest fill factor values achievable with current commercial CPV modules. Moreover, such a high value of filling factor is indicative of high levels of beam spatial and spectral homogeneities.

Of course, numerous modifications could be made to the embodiments described above without departing from the scope of the present invention.

The invention claimed is:

1. A solar concentrator for concentrating solar radiation toward a solar cell, the solar concentrator comprising:
   a primary optical element configured to collect and focus the solar radiation; and
   a secondary optical element having an input end and an output end, the secondary optical element being arranged to receive the solar radiation collected and focused by the primary optical element to a focal point on the input end of the secondary optical element,
   wherein the secondary optical element comprises
      a straight input section having a constant cross-sectional area and extending from the input end to an intermediate location along the length of the secondary optical element, and
      an adiabatically tapered section tapering at a tapering angle from the intermediate location down toward the output end, the tapering angle being less than five degrees, the adiabatically tapered section having at the intermediate location the same cross-sectional area as the straight input section,
   wherein the straight input section is configured to guide the solar radiation from the focal point at the input end to the adiabatically tapered section, and
   wherein the adiabatically tapered section is configured to concentrate and adiabatically guide by total internal reflection the solar radiation received from the straight input section toward the output end where the solar radiation exits the secondary optical element.

2. The solar concentrator according to claim 1, wherein the input and output ends of the secondary optical element have respective surface areas configured to provide the secondary optical element with a concentration factor of between about 2 and 25.

3. The solar concentrator according to claim 1, wherein the adiabatically tapered section has a length of between about 5 millimeters and 120 millimeters.

4. The solar concentrator according to claim 1, wherein the secondary optical element further comprises a cladding disposed on at least a portion of an outer periphery thereof, the cladding being made of a material having a refractive index lower than a refractive index of the secondary optical element.

5. The solar concentrator according to claim 1, wherein the secondary optical element comprises a straight output section at the output end thereof.

6. The solar concentrator according to claim 1, wherein the secondary optical element further comprises an antireflection coating deposited on at least one of the input end and the output end thereof.

7. A concentrated photovoltaic (CPV) module comprising:
   a solar concentrator for concentrating solar radiation, the solar concentrator comprising:
      a primary optical element configured to collect and focus the solar radiation; and
      a secondary optical element having an input end and an output end, the secondary optical element being arranged to receive the solar radiation collected and focused by the primary optical element to a focal point on the input end of the secondary optical element, wherein the secondary optical element comprises
         a straight input section having a constant cross-sectional area and extending from the input end to an intermediate location along the length of the secondary optical element, and
         an adiabatically tapered section tapering at a tapering angle from the intermediate location down toward the output end, the tapering angle being less than five degrees, the adiabatically tapered section having at the intermediate location the same cross-sectional area as the straight input section,
      wherein the straight input section is configured to guide the solar radiation from the focal point at the input end to the adiabatically tapered section, and
      wherein the adiabatically tapered section is configured to concentrate and adiabatically guide by total internal reflection the solar radiation received from the straight input section toward the output end where the solar radiation exits the secondary optical element; and
   a solar cell positioned to receive the solar radiation concentrated by the solar concentrator and to convert the same into electricity.

8. The CPV module according to claim 7, wherein the input and output ends of the secondary optical element have respective surface areas selected to provide the secondary optical element with a concentration factor of between about 2 and 25.

9. The CPV module according to claim 7, wherein the adiabatically tapered section has a length of between about 5 millimeters and 120 millimeters.

10. The CPV module according to claim 7, wherein the secondary optical element further comprises a cladding disposed on at least a portion of an outer periphery thereof, the cladding being made of a material having a refractive index lower than a refractive index of the secondary optical element.

11. The CPV module according to claim 7, wherein the secondary optical element comprises a straight output section at the output end thereof.

12. The CPV module according to claim 7, wherein the secondary optical element comprises an antireflection coating deposited on at least one of the input end and the output end thereof.

13. The CPV module according to claim 7, wherein the solar cell has lateral dimensions of between about 100 micrometers and 10 millimeters.

14. The CPV module according to claim 7, further comprising an optically transparent gel-based material bridging a gap and providing an optical contact between the output end of the secondary optical element and the solar cell.

15. The CPV module according to claim 7, further comprising a housing enclosing the secondary optical element and the solar cell, the housing comprising an optically transparent window corresponding at least in part to the primary optical element.

16. The CPV module according to claim 15, further comprising a support member provided inside the housing and holding the secondary optical element fixedly in place with respect to the solar cell.

17. The solar concentrator according to claim 1, wherein the adiabatically tapered section tapers linearly from the intermediate location down toward the output end.

18. The solar concentrator according to claim 1, wherein the straight input section and the adiabatically tapered section each have a circular transverse cross-section.

19. The CPV module according to claim 7, wherein the adiabatically tapered section tapers linearly from the intermediate location down toward the output end.

20. The CPV module according to claim 7, wherein the straight input section and the adiabatically tapered section each have a circular transverse cross-section.

* * * * *